United States Patent
Adiga et al.

(10) Patent No.: US 11,289,637 B2
(45) Date of Patent: Mar. 29, 2022

(54) TRANSMON QUBITS WITH TRENCHED CAPACITOR STRUCTURES

(71) Applicant: International Business Machines Corporation, Armonk, NY (US)

(72) Inventors: Vivekananda P. Adiga, Ossining, NY (US); Martin O. Sandberg, Ossining, NY (US); Jerry M. Chow, White Plains, NY (US); Hanhee Paik, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 245 days.

(21) Appl. No.: 16/381,563

(22) Filed: Apr. 11, 2019

(65) Prior Publication Data
US 2020/0328338 A1 Oct. 15, 2020

(51) Int. Cl.
*H01L 39/22* (2006.01)
*H01L 39/02* (2006.01)
(Continued)

(52) U.S. Cl.
CPC ........... *H01L 39/025* (2013.01); *G06N 10/00* (2019.01); *H01L 39/12* (2013.01); *H01L 39/223* (2013.01); *H01L 39/2493* (2013.01)

(58) Field of Classification Search
CPC ..... G06N 10/00; H01L 39/025; H01L 39/045; H01L 39/12; H01L 39/223;
(Continued)

(56) References Cited

U.S. PATENT DOCUMENTS 6,605,225 B1 * 8/2003 Yamashita ............. B82Y 10/00
216/3
6,635,898 B2 10/2003 Williams et al.
(Continued)

FOREIGN PATENT DOCUMENTS

EP 1262911 A1 * 12/2002 ............. B82Y 10/00
EP 1262911 A1 12/2002
(Continued)

OTHER PUBLICATIONS

"Suspending superconducting qubits by silicon micromachining" by Y. Chu et al. in Appl. Phys. Lett. 109, 112601 (2016) (Year: 2016).*

(Continued)

*Primary Examiner* — Eric A. Ward
(74) *Attorney, Agent, or Firm* — Garg Law Firm, PLLC; Rakesh Garg; Douglas Pearson

(57) ABSTRACT

A qubit includes a substrate, and a first capacitor structure having a lower portion formed on a surface of the substrate and at least one first raised portion extending above the surface of the substrate. The qubit further includes a second capacitor structure having a lower portion formed on the surface of the substrate and at least one second raised portion extending above the surface of the substrate. The first capacitor structure and the second capacitor structure are formed of a superconducting material. The qubit further includes a junction between the first capacitor structure and the second capacitor structure. The junction is disposed at a predetermined distance from the surface of the substrate and has a first end in contact with the first raised portion and a second end in contact with the second raised portion.

6 Claims, 10 Drawing Sheets

(51) Int. Cl.
*G06N 10/00* (2022.01)
*H01L 39/12* (2006.01)
*H01L 39/24* (2006.01)

(58) Field of Classification Search
CPC ............. H01L 39/2403; H01L 39/2393; H01L 39/00–2496; H01L 28/00–92; H01G 2/00–24; H01G 4/00–40
See application file for complete search history.

(56) References Cited

U.S. PATENT DOCUMENTS

| | | | |
|---|---|---|---|
| 6,788,175 B1* | 9/2004 | Prophet | B81B 3/0078 |
| | | | 200/181 |
| 9,564,573 B1 | 2/2017 | Chang et al. | |
| 10,068,181 B1 | 9/2018 | Rigetti et al. | |
| 10,068,184 B1 | 9/2018 | Hertzberg et al. | |
| 10,134,972 B2 | 11/2018 | Oliver et al. | |
| 11,094,873 B2* | 8/2021 | Adiga | H01L 39/12 |
| 2006/0046487 A1* | 3/2006 | Miyazaki | H01L 21/3085 |
| | | | 438/689 |
| 2014/0264286 A1* | 9/2014 | Chang | H01L 39/2493 |
| | | | 257/31 |
| 2017/0178810 A1* | 6/2017 | Berdy | H01L 28/87 |
| 2018/0138987 A1* | 5/2018 | Sliwa | G06N 10/00 |
| 2018/0247974 A1 | 8/2018 | Oliver et al. | |
| 2019/0044046 A1 | 2/2019 | Caudillo et al. | |
| 2019/0288176 A1* | 9/2019 | Yoscovits | H01L 39/2493 |
| 2019/0385673 A1* | 12/2019 | Bosman | G11C 11/44 |
| 2020/0176552 A1* | 6/2020 | Chang | H01L 21/02271 |

FOREIGN PATENT DOCUMENTS

| | | | |
|---|---|---|---|
| WO | 2018125604 A1 | 7/2018 | |
| WO | WO-2018125604 A1 * | 7/2018 | ............. H01L 39/24 |

OTHER PUBLICATIONS

J.M. Gambetta et al., Investigating surface loss effects in superconducting transmon qubits, May 25, 2016.
Jens Koch et al., Charge-insensitive qubit design derived from the Cooper pair box, May 22, 2007.
Magali Brunet et al., High-Density 3-D Capacitors for Power Systems On-Chip: Evaluation of a Technology Based on Silicon Submicrometer Pore Arrays Formed by Electrochemical Etching, Sep. 2013.
International Searching Authority, PCT/EP2020/059725, May 8, 2020.
PCT, Written Opinion, PCT/EP2020/059725, PCT/ISA/220, May 8, 2020.

* cited by examiner

TRANSMON QUBITS WITH TRENCHED CAPACITOR STRUCTURES

TECHNICAL FIELD

The present invention relates generally to a superconducting device, a fabrication method, and fabrication system for reducing the footprint of qubits in superconducting quantum logic circuits. More particularly, the present invention relates to a device, method, and system for transmon qubits with trenched capacitor structures.

BACKGROUND

Hereinafter, a "Q" or "q" prefix in a word of phrase is indicative of a reference of that word or phrase in a quantum computing context unless expressly distinguished where used.

Molecules, atoms and subatomic particles follow the laws of quantum mechanics, a branch of physics that explores how the physical world works at the most fundamental levels. At this level, particles behave in non-intuitive ways, taking on more than one state at the same time (superposition), and particles can display strong correlations that cannot be explained through classical physics (entanglement). Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits) to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on quantum bits (qubits), which operate according to two key principles of quantum physics: superposition and entanglement. Superposition means that each qubit can represent both a 1 and a 0 at the same time. Entanglement means that qubits can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that theoretically allow them to solve hard problems that are intractable using conventional computers. IBM has successfully constructed and demonstrated the operability of a quantum processor (IBM is a registered trademark of International Business Machines corporation in the United States and in other countries.)

A superconducting qubit may include a Josephson junction. A Josephson tunnel junction is formed by separating two thin-film superconducting material layers by a non-superconducting material. When the metal in the superconducting layers are in the superconducting state—e.g. by reducing the temperature of the metal to a specified cryogenic temperature—pairs of electrons (called Cooper pairs) can tunnel from one superconducting layer through the non-superconducting layer to the other superconducting layer. In a superconducting qubit, the Josephson junction—which has a small inductance—is electrically coupled in parallel with one or more capacitive circuit elements forming a nonlinear resonator.

The information encoded in these type of qubits is in the form of microwave energy in a range of microwave frequencies. A single microwave excitation can either be present in the qubit or not, corresponding to 1 or 0. For quantum computing to be reliable, quantum circuits, e.g., the qubits themselves, the readout circuitry associated with the qubits, and other types of superconducting quantum logic circuits, must not alter the energy states excitation of the qubit. This operational constraint on any circuit that operates with quantum information necessitates special considerations in fabricating semiconductor structures that are used in such a circuit.

SUMMARY

The illustrative embodiments provide a semiconductor device, and a method and system of fabrication therefor. An embodiment of a qubit includes a substrate, and a first capacitor structure having a lower portion formed on a surface of the substrate and at least one first raised portion extending above the surface of the substrate. The embodiment further includes a second capacitor structure having a lower portion formed on the surface of the substrate and at least one second raised portion extending above the surface of the substrate. In the embodiment, the first capacitor structure and the second capacitor structure are formed of a superconducting material. The embodiment still further includes a junction between the first capacitor structure and the second capacitor structure. In the embodiment, the junction is disposed at a predetermined distance from the surface of the substrate and has a first end in contact with the first raised portion and a second end in contact with the second raised portion.

In another embodiment, the junction is formed of an insulating material sandwiched between superconducting material. In another embodiment, the superconducting material is aluminum.

In another embodiment, the junction comprises a Josephson junction.

In another embodiment, the superconducting material is Niobium (Nb) and the substrate comprises Silicon (Si).

In another embodiment, the first capacitor structure and the second capacitor structure are of a trapezoidal shape.

Another embodiment further includes a cavity formed between the junction and the substrate.

An embodiment includes a fabrication method for fabricating the semiconductor device.

An embodiment includes a fabrication system for fabricating the semiconductor device.

BRIEF DESCRIPTION OF THE DRAWINGS

The novel features of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

The illustrative embodiments used to describe the invention generally address and solve the need for reducing the footprint of qubits in superconducting quantum logic circuits. The illustrative embodiments provide a fabrication method for qubits with trenched capacitor structures.

Figure 1:
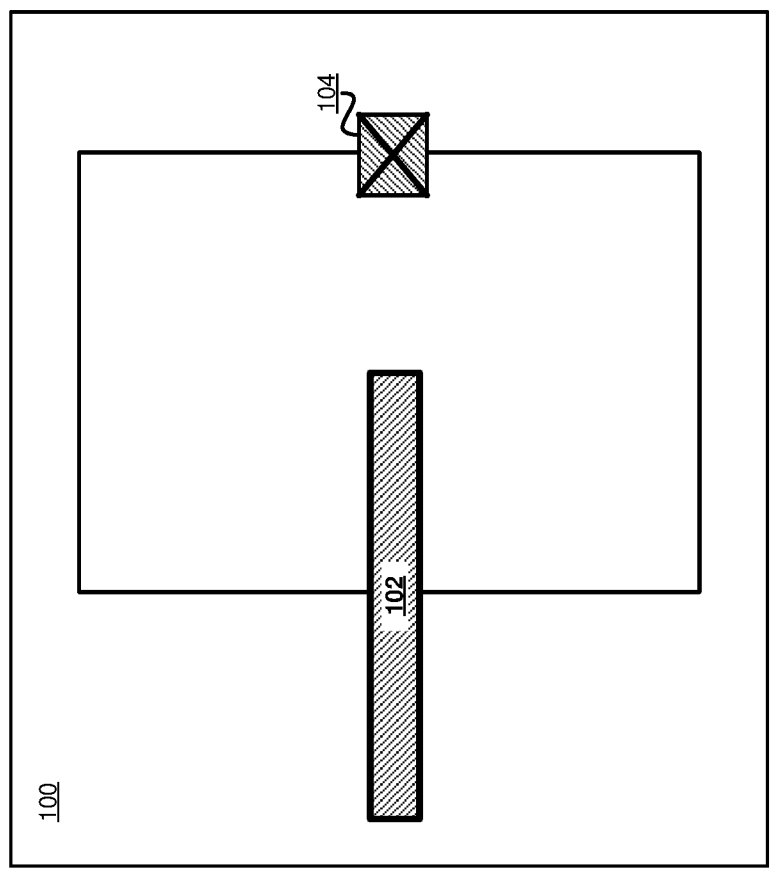
FIG. 1 depicts a schematic of a qubit in accordance with an illustrative embodiment.

With reference to FIG. 1, this figure depicts a schematic of a qubit 100 in accordance with an illustrative embodiment. A capacitor 102 is coupled to a Josephson junction 104 in qubit 100. The illustrative embodiments recognize that a capacitor, such as capacitor 102 that is used in a superconducting quantum logic circuit, and particularly in a qubit— e.g. in conjunction with a Josephson junction—has to be fabricated according to operational constraints. The presently used capacitor structure in a qubit is significantly larger in size than the size of the Josephson junction (e.g., Josephson junction 104) therein.

The large size of the capacitor limits the number of qubits and other quantum readout circuitry that can be fabricated per die in a fabrication process. The illustrative embodiments recognize that a need exists for a method of fabricating a qubit that is significantly smaller in the area occupied on the chip as compared to the presently used capacitor structures in quantum circuits, e.g., qubit 100. A capacitor is a capacitive device structure fabricated using superconducting material(s), where the capacitive structure is usable in a superconducting quantum logic circuit which can store a single quantum of microwave energy during the operation cycle of the quantum logic circuit. Any absorption or dissipation of this energy, any spontaneous additions of energy, or fluctuations in the capacitance, arising in the capacitor, will degrade the circuit performance. An acceptable maximum threshold of these effects may be defined for a capacitor to function in the quantum logic circuit. A capacitor can be fabricated by using one or more superconducting materials on a silicon substrate in a semiconductor fabrication process, as described herein.

An embodiment described herein provides for a transmon qubit and method of fabrication of a transmon qubit with trenched capacitor structure that reduces the overall size of the qubit, thereby reducing losses associated with qubit size. One or more embodiments provide for a qubit design that reduces far field and near field coupling to external devices and reduces the overall area occupied by the qubit.

An embodiment can be implemented as a qubit device in superconducting quantum logic circuit, including but not limited to as a capacitor coupled to a Josephson junction in a qubit chip. A fabrication method for can be implemented as a software application. The application implementing an embodiment can be configured to operate in conjunction with an existing semiconductor fabrication system—such as a lithography system.

For the clarity of the description, and without implying any limitation thereto, the illustrative embodiments are described using a simplified diagram of the example qubit in the figures and the illustrative embodiments. In an actual fabrication of a qubit, additional structures that are not shown or described herein, or structures different from those shown and described herein, may be present without departing the scope of the illustrative embodiments. Similarly, within the scope of the illustrative embodiments, a shown or described structure in the example qubit may be fabricated differently to yield a similar operation or result as described herein.

Differently shaded portions in the two-dimensional drawing of the example structures, layers, and formations are intended to represent different structures, layers, materials, and formations in the example fabrication, as described herein. The different structures, layers, materials, and formations may be fabricated using suitable materials that are known to those of ordinary skill in the art.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual photolithography to achieve an objective according to the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

The illustrative embodiments are described with respect to certain types of materials, electrical properties, structures, formations, layers orientations, directions, steps, operations, planes, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific designs, architectures, layouts, schematics, and tools only as examples and are not limiting to the illustrative embodiments. The illustrative embodiments may be used in conjunction with other comparable or similarly purposed designs, architectures, layouts, schematics, and tools.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

A qubit is only used as a non-limiting example superconducting quantum logic circuit in which an embodiment can be used. From this disclosure, those of ordinary skill in the art will be able to conceive many other superconducting quantum logic circuits in which the trenched capacitor structures of the illustrative embodiments will be usable, and the same are contemplated within the scope of the illustrative embodiments.

Figure 2:
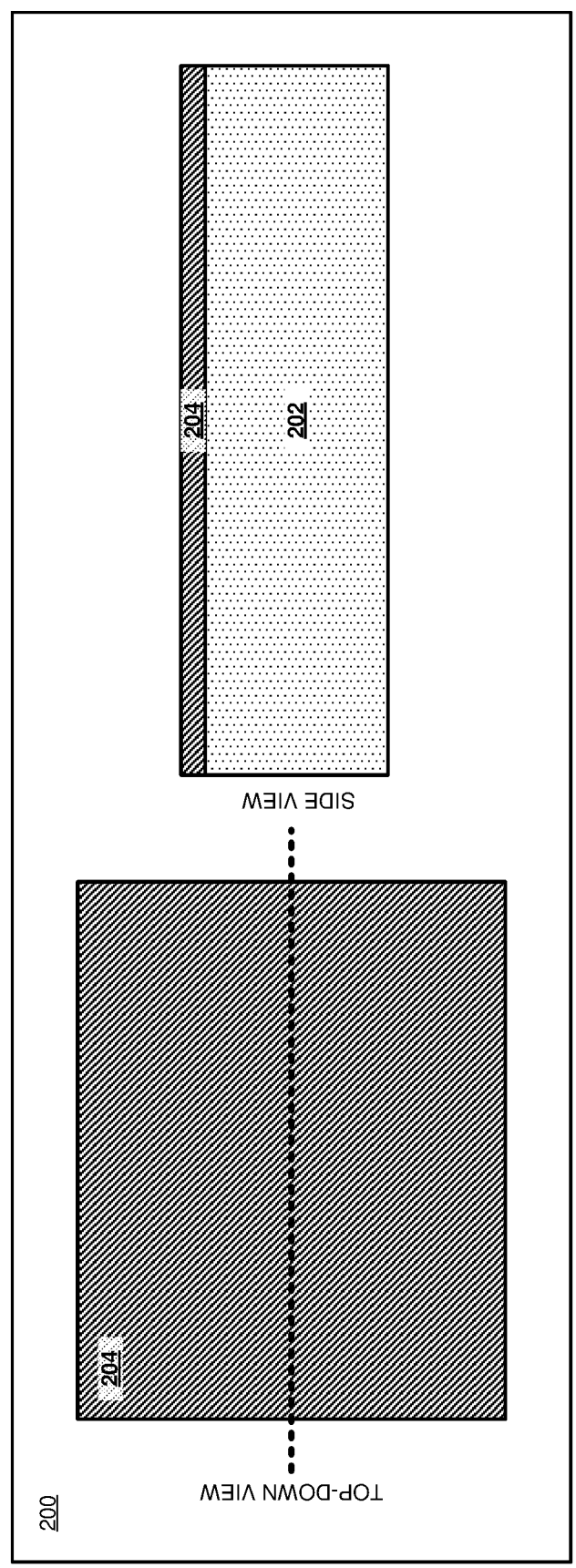
FIG. 2 depicts a step in an example fabrication process for a transmon qubit with a trenched capacitor structure in accordance with an illustrative embodiment.

FIGS. 2-9 depict top-down views and side views of various example steps of one example fabrication process for fabricating a transmon qubit with a trenched capacitor structure in accordance with an illustrative embodiment. With reference to FIG. 2, this figure depicts a step in an example fabrication process for a transmon qubit with a trenched capacitor structure in accordance with an illustrative embodiment. In step 200, a layer 204 of a suitable sacrificial material is deposited on a top surface of a substrate 202. As an example, substrate 202 is formed of a suitable substrate material, such as, but not limited to, Silicon (Si). Alternatively, in a particular embodiment, sapphire may be used instead of silicon. Essentially, these types of substrate are compatible with low loss in the microwave regime. As an example, sacrificial material layer 204 is formed of a sacrificial oxide. For a non-limiting deposition method of layering, sputtering may be utilized.

Figure 3:
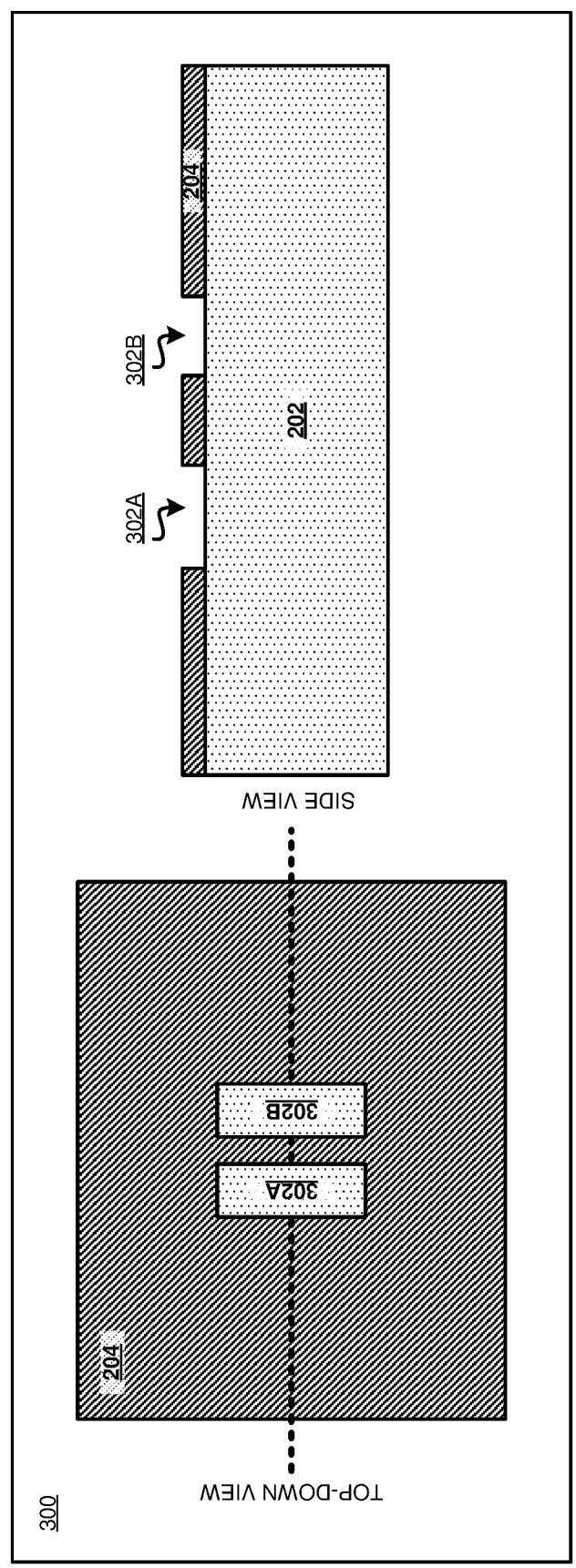
FIG. 3 depicts another step in the example fabrication process for a transmon qubit with a trenched capacitor structure in accordance with an illustrative embodiment.

With reference to FIG. 3, this figure depicts another step in the example fabrication process for a transmon qubit with a trenched capacitor structure in accordance with an illustrative embodiment. In step 300, qubit pockets 302A and 302B are patterned as defined portions of sacrificial material layer 204 using a single step lithography process, and the defined portions of sacrificial material layer 204 are etched down to substrate 202. In the illustrated embodiment, qubit pockets 302A and 302B are shown as having a rectangular shape. In other particular embodiments, any number of suitable qubit pockets having any desired shape and/or size may be etched into substrate 202. The patterning and etching process of step 300 can be implemented using an existing lithography system.

Figure 4:
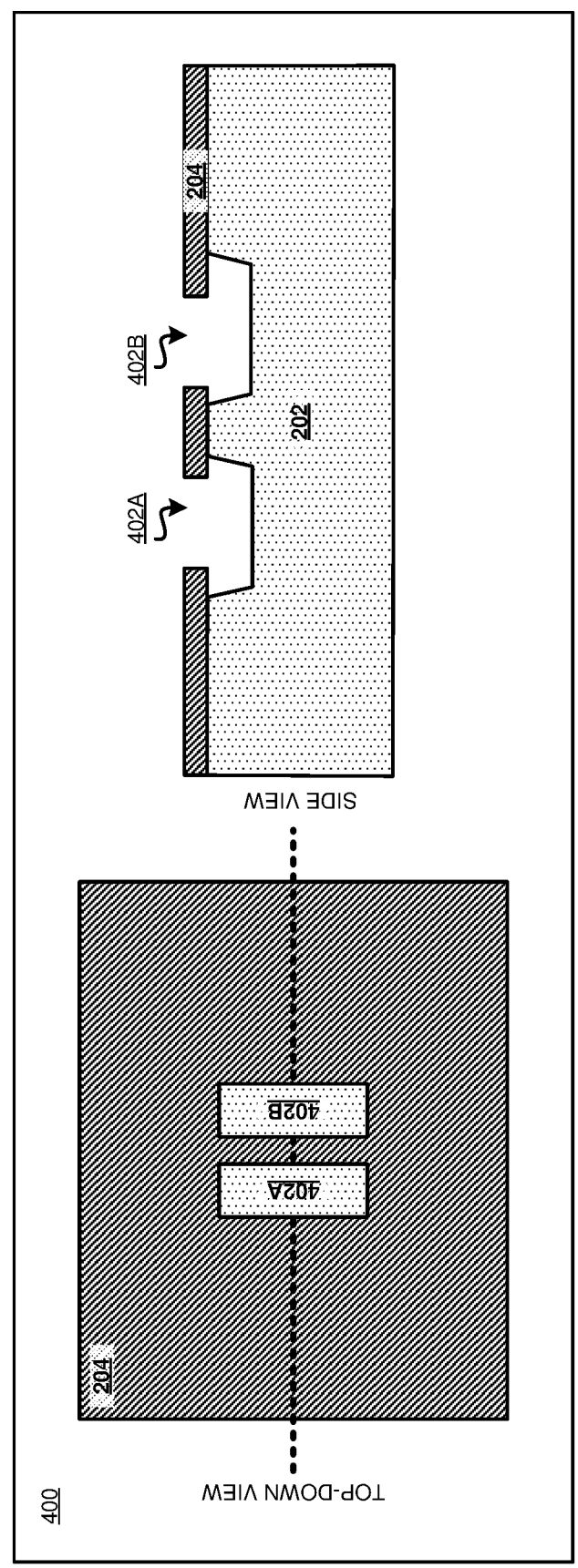
FIG. 4 depicts another step in the example fabrication process for a transmon qubit with a trenched capacitor structure in accordance with an illustrative embodiment.

With reference to FIG. 4, this figure depicts another step in the example fabrication process for a transmon qubit with a trenched capacitor structure in accordance with an illustrative embodiment. In step 400, substrate 202 is etched at qubit pockets 302A and 302B to a designated depth using an etching process to form trenches 402A and 402B with angled sidewalls and a flat bottom, and having a trapezoidal cross-section. In a particular embodiment, substrate 202 is etched at qubit pockets 302A and 302B using an anisotropic wet etching process along a (100) silicon plane to create a trench having a trapezoidal cross-section. In other particular embodiments, trenches 402A and 402B may be of any suitable shape and/or geometry such as having vertical sidewalls.

Figure 5:
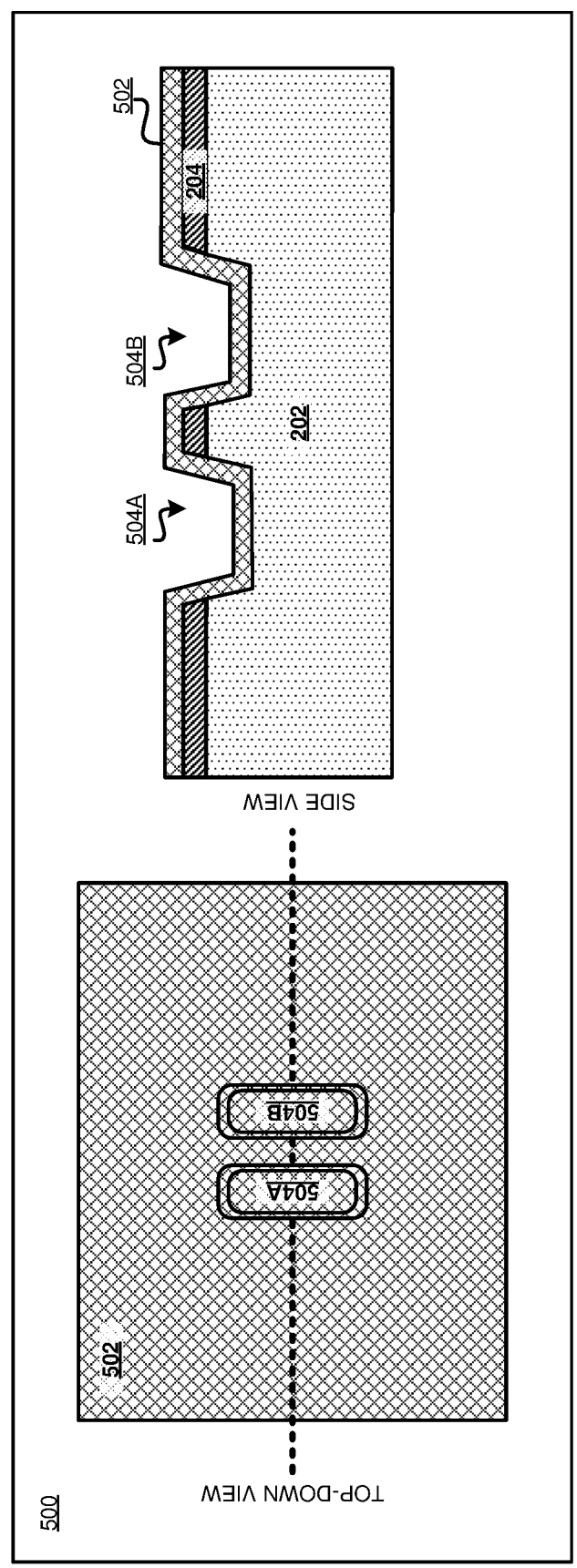
FIG. 5 depicts another step in the example fabrication process for a transmon qubit with a trenched capacitor structure in accordance with an illustrative embodiment.

With reference to FIG. 5, this figure depicts another step in the example fabrication process for a transmon qubit with a trenched capacitor structure in accordance with an illustrative embodiment. In step 500, a superconducting material 502 is deposited on the bottom and sidewalls of trenches 402A and 402B to form trench structures 504A and 504B and upon remaining portions of sacrificial material layer 204. In a particular embodiment, superconducting material 502 includes a superconducting metal such as Niobium (Nb). For a non-limiting deposition method of superconducting material 502, sputtering or other blanket deposition processes may be utilized.

Figure 6:
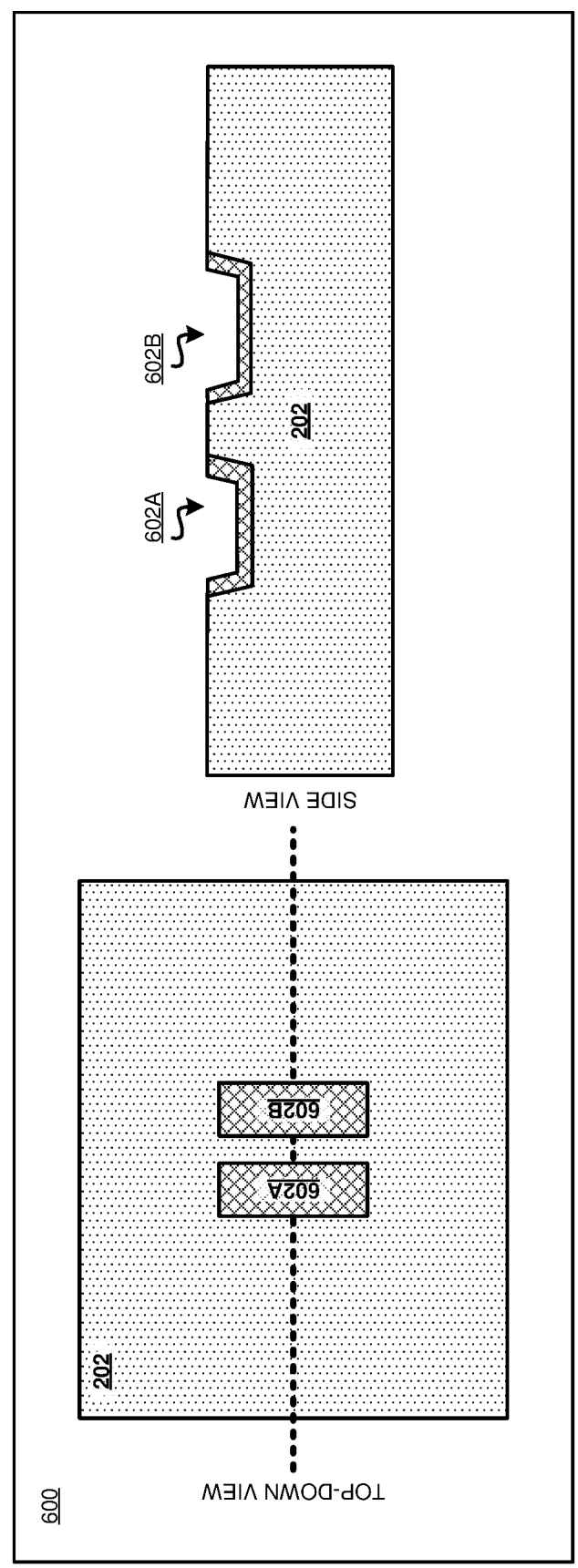
FIG. 6 depicts another step in the example fabrication process for a transmon qubit with a trenched capacitor structure in accordance with an illustrative embodiment.

With reference to FIG. 6, this figure depicts another step in the example fabrication process for a transmon qubit with a trenched capacitor structure in accordance with an illustrative embodiment. In step 600, superconducting material 502 and sacrificial material layer 204 are removed from the non-trench portions of substrate 202 to form capacitor structures 602A and 602B. In a particular embodiment, superconducting material 502 and sacrificial material layer 204 is removed from the non-trench portions of substrate 202 using a chemical mechanical polish (CMP) process and an oxide wet etch process.

Figure 7:
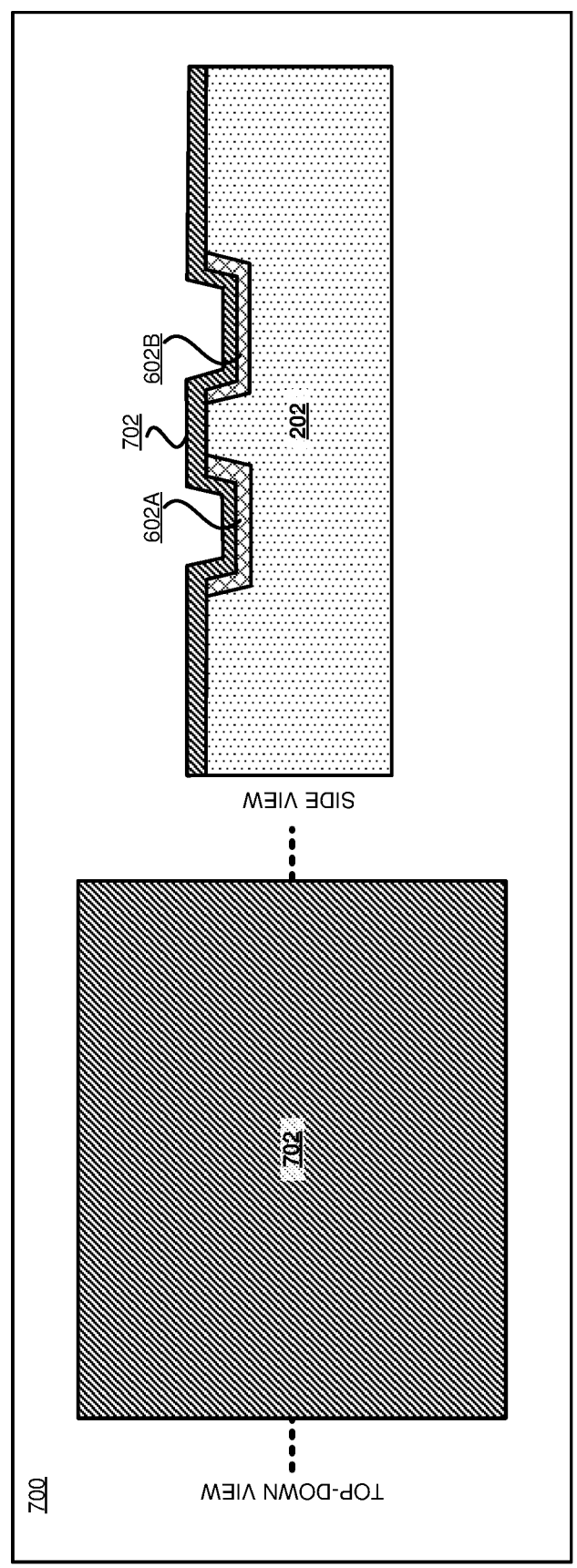
FIG. 7 depicts another step in the example fabrication process for a transmon qubit with a trenched capacitor structure in accordance with an illustrative embodiment.

With reference to FIG. 7, this figure depicts another step in the example fabrication process for a transmon qubit with a trenched capacitor structure in accordance with an illustrative embodiment. In step 700, a pattern film 702 is deposited on the top surfaces of substrate 202 and capacitor structures 602A and 602B and a lithography process is performed to prepare for Josephson junction fabrication. In a particular embodiment, a resist spin process is used to deposit a photoresist pattern fill followed by a lithographic exposure and development is performed to prepare for junction evaporation.

Figure 8:
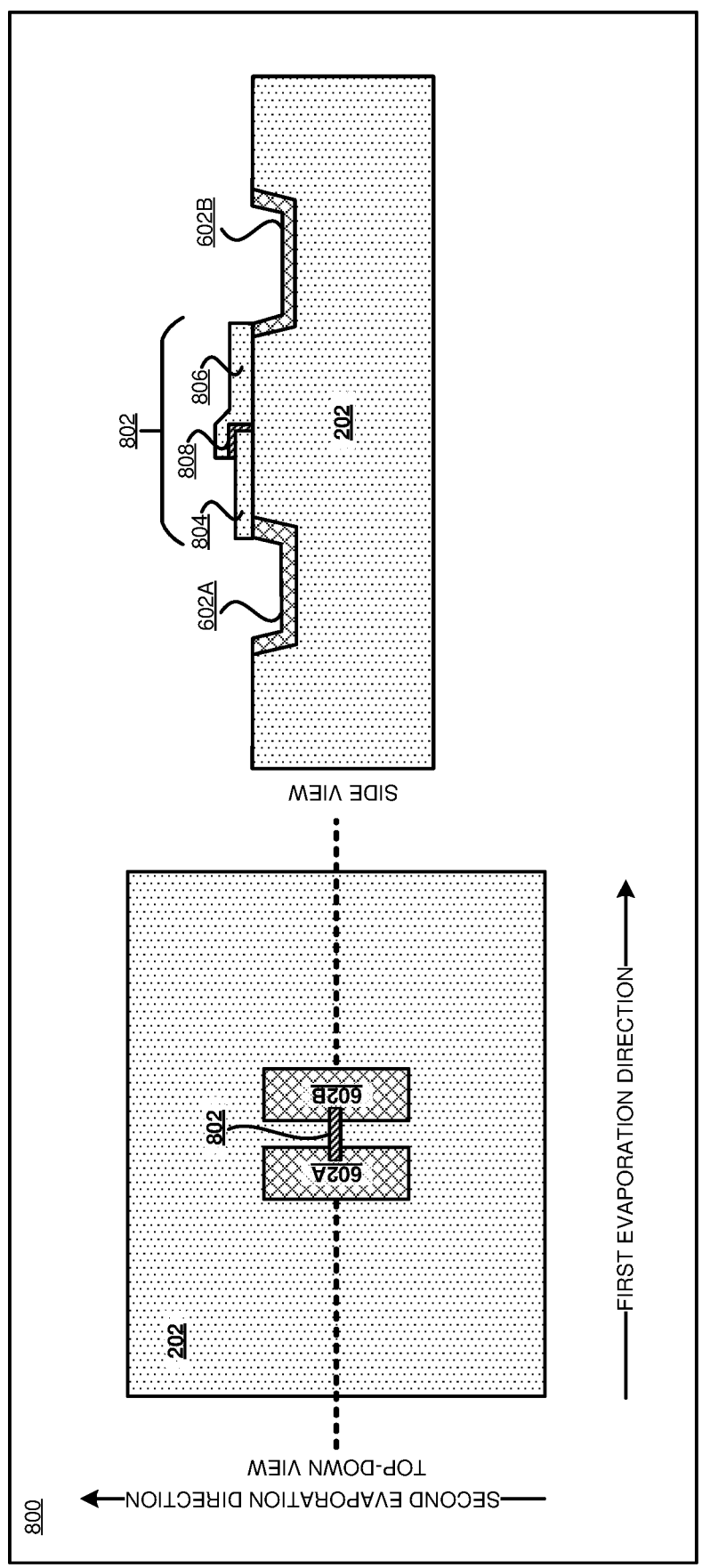
FIG. 8 depicts another step in the example fabrication process for a transmon qubit with a trenched capacitor structure in accordance with an illustrative embodiment.

With reference to FIG. 8, this figure depicts another step in the example fabrication process for a transmon qubit with a trenched capacitor structure in accordance with an illustrative embodiment. In step 800, remaining oxide is removed from capacitor structures 602A and 602B using an ion milling process. A Josephson junction 802 is fabricated between capacitor structures 602A and 602B using an evaporation and liftoff technique with a first end and a second end of Josephson junction 802 in contact with a portion of capacitor structure 602A and 602B, respectively. In a particular embodiment, Josephson junction 802 is formed of a metal material such as aluminum (Al). In other particular embodiments, any suitable material may be used to form Josephson junction 802.

In the embodiment illustrated in FIG. 8, Josephson junction 802 includes a first superconducting material layer 804 connected to first capacitor structure 602A, a second superconducting material layer 806 connected to second capacitor structure 602B, and a tunnel barrier 808 disposed between first superconducting material layer 804 and second superconducting material layer 806. In a particular embodiment, first superconducting material layer 804 and second superconducting material layer 806 are formed of aluminum or another suitable superconducting material, and tunnel barrier 808 is formed of aluminum oxide.

In a particular embodiment, Josephson junction 802 is formed using a shadow evaporation process by suspending an evaporation mask above substrate 202 and projecting a shadow of the mask at a predetermined angle. In a particular embodiment, the junction evaporation is performed in two different directions including a first direction and a second direction substantially perpendicular to the first direction with respect to the top-down view of substrate 202.

Figure 9:
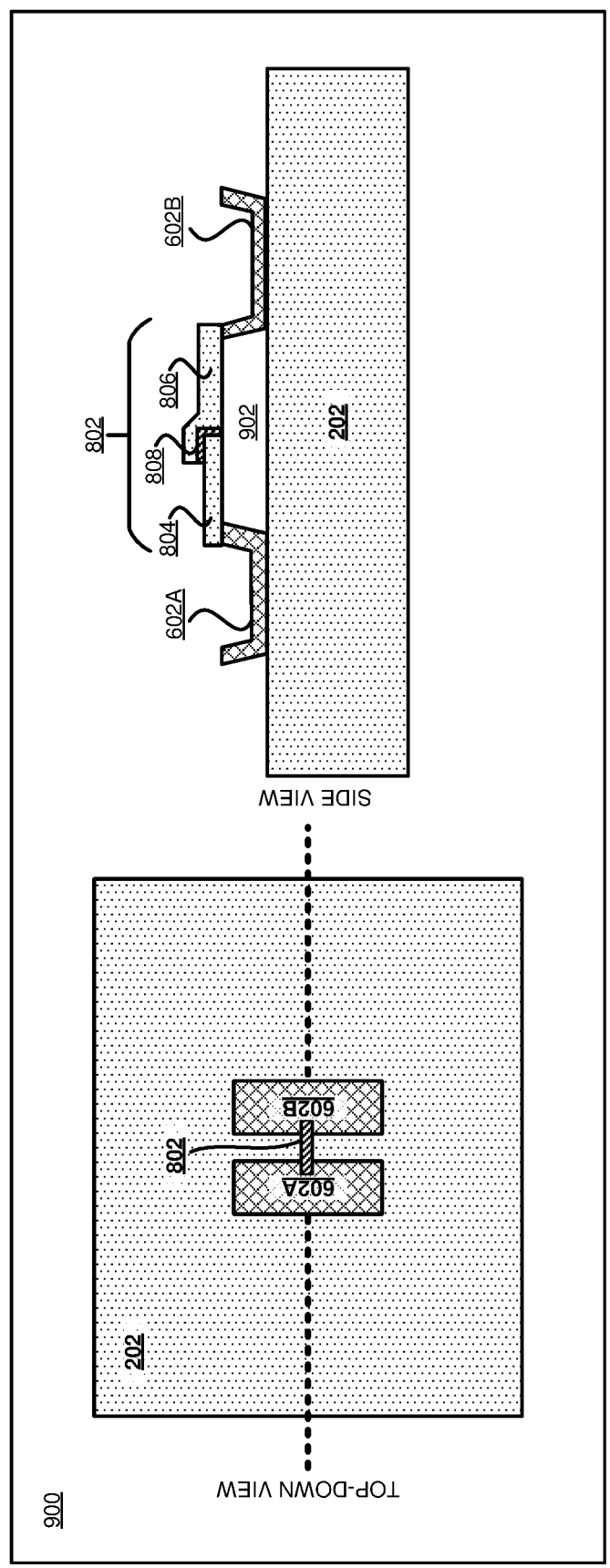
FIG. 9 depicts another step in the example fabrication process for a transmon qubit with a trenched capacitor structure in accordance with an illustrative embodiment.

With reference to FIG. 9, this figure depicts another step in the example fabrication process for a transmon qubit with a trenched capacitor structure in accordance with an illustrative embodiment. In step 900, portions of substrate 202 are removed using a subtractive etching process to expose raised portions of capacitor structures 602A and 602B and form a cavity 902 between Josephson junction 802 and substrate 202. As a result, each of capacitor structures 602A and 602B have a lower portion formed on the surface of substrate 202 and at least one raised portion extending above the surface of substrate 202. Further, Josephson junction 802 is suspended at a predetermined distance above substrate 202. In a particular embodiment, capacitor structures 602A and 602B are of a generally trapezoidal shape. In particular embodiments, a capacitance associated with the qubit may be changed based upon the predetermined distance. Accordingly, a qubit is formed having a reduced footprint and/or reduced loss compared to conventionally fabricated qubits. In a particular embodiment, a capacitance of the qubit may be increased by 50% for a 10 micrometer depth, thus reducing qubit size and losses associated with the qubit. In particular embodiments, substrate/metal to air loss may be significantly reduced by the removal of the portions of the substrate surrounding the capacitor structures.

Figure 10:
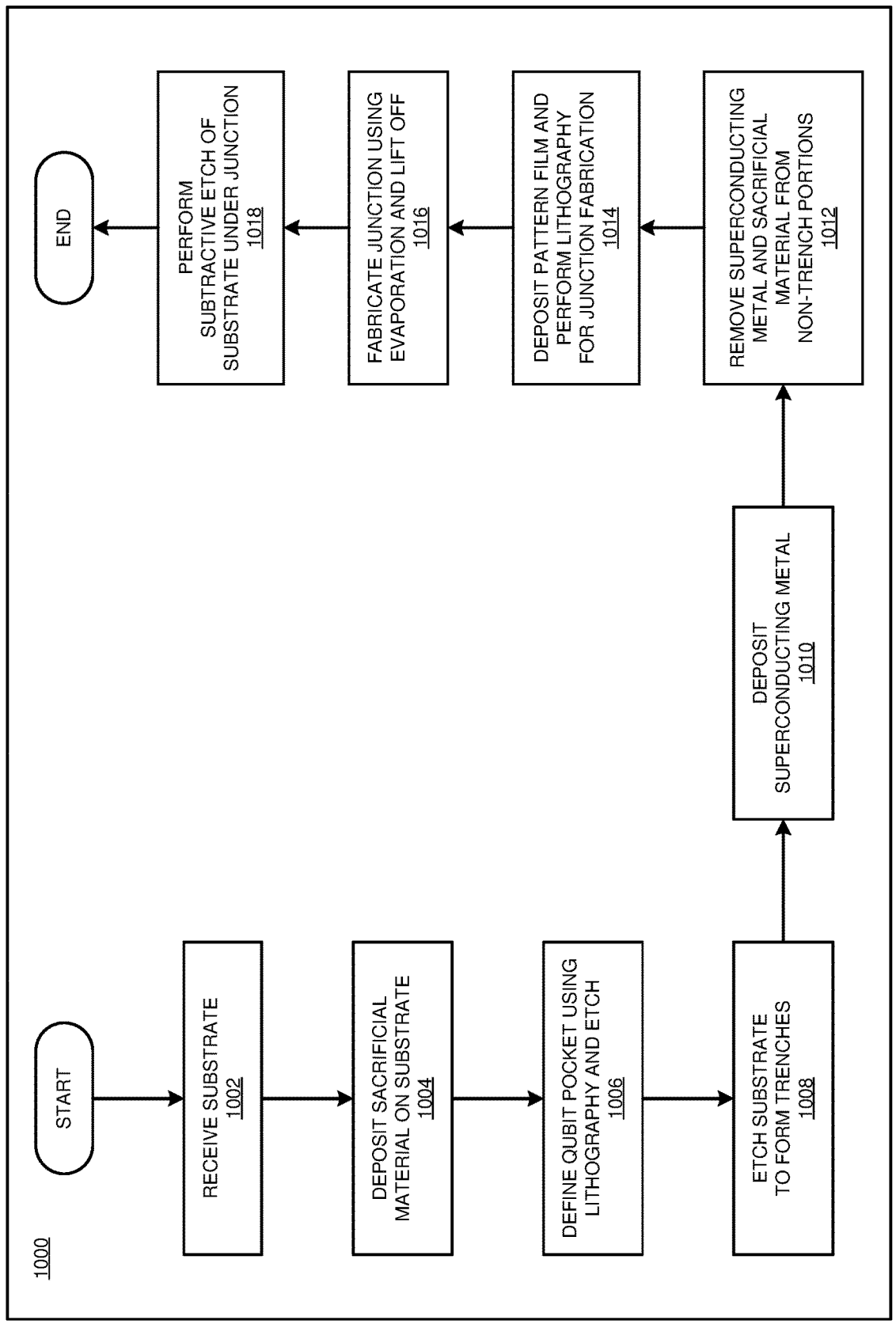
FIG. 10 depicts a flowchart of an example process for fabricating a transmon qubit with a trenched capacitor structure in accordance with an illustrative embodiment.

With reference to FIG. 10, this figure depicts a flowchart of an example process 1000 for fabricating a transmon qubit with a trenched capacitor structure in accordance with an illustrative embodiment. In one or more embodiments, process 1000 can be implanted by a fabrication system to perform one or more steps of FIGS. 2-9.

In block 1002, the fabrication system receives substrate 202. In block 1004, the fabrication system deposits sacrificial material layer 204 on a top surface of substrate 202. As an example, substrate 202 is formed of a suitable substrate material, such as, but not limited to, Silicon (Si). Alternatively, in a particular embodiment, sapphire may be used instead of silicon. As an example, sacrificial material layer 204 is formed of a sacrificial oxide. For a non-limiting deposition method of layering, sputtering may be utilized.

In block 1006, the fabrication system qubit pockets 302A and 302B defines portions of sacrificial material layer 204 using a single step lithography process, and etches the defined portions of sacrificial material layer 204 down to substrate 202. In particular embodiments, the patterning and etching process of step 300 can be implemented using an existing lithography system. In block 1108, the fabrication system etches qubit pockets 302A and 302B to form trenches 402A and 402B. In a particular embodiment, trenches 402A and 402B are formed with angled sidewalls and a flat bottom, and having a trapezoidal cross-section. In a particular embodiment, substrate 202 is etched at qubit pockets 302A and 302B using an anisotropic wet etching process along a (100) silicon plane to create a trench having a trapezoidal cross-section. In other particular embodiments, trenches 402A and 402B may be of any suitable shape and/or geometry such as having vertical sidewalls.

In block 1010, the fabrication system deposits a superconducting material 502 on the bottom and sidewalls of trenches 402A and 402B to form trench structures 504A and 504B and upon remaining portions of sacrificial material layer 204. In a particular embodiment, superconducting material 502 includes a superconducting metal such as Niobium (Nb). For a non-limiting deposition method of superconducting material 502, sputtering or other blanket deposition processes may be utilized.

In block 1012, the fabrication system removes superconducting material 502 and sacrificial material layer 204 from the non-trench portions of substrate 202 to form capacitor structures 602A and 602B. In a particular embodiment, superconducting material 502 and sacrificial material layer 204 is removed from the non-trench portions of substrate 202 using a chemical mechanical polish (CMP) process and an oxide wet etch process.

In block 1014, the fabrication system deposits a pattern film 702 on the top surfaces of substrate 202 and capacitor structures 602A and 602B and performs a lithography process to prepare for Josephson junction fabrication. In a particular embodiment, a resist spin process is used to deposit a photoresist pattern fill followed by a lithographic exposure and development is performed to prepare for junction evaporation.

In block 1016, the fabrication system fabricates a junction, such as Josephson junction 802, between capacitor structures 602A and 602B using an evaporation and liftoff technique with a first end and a second end of Josephson junction 802 in contact with a portion of capacitor structure 602A and 602B, respectively. In a particular embodiment, the junction is formed of a metal material such as aluminum (Al). In other particular embodiments, any suitable material may be used to form the junction.

In a particular embodiment, the junction is formed using a shadow evaporation technique by suspending an evaporation mask above substrate 202 and projecting a shadow of the mask at a predetermined angle. In a particular embodiment, the junction evaporation is performed in two different directions including a first direction and a second direction substantially perpendicular to the first direction with respect to the top-down view of substrate 202.

In block 1018, the fabrication system removes portions of substrate 202 under the junction using a subtractive etching process to expose leg portions of capacitor structures 602A and 602B and form a cavity between the junction and substrate 202. As a result, the junction is suspended at a predetermined distance above substrate 202. Accordingly, a transmon qubit with a trenched capacitor structure is fabricated. Process 1000 then ends.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A qubit comprising:
   a substrate;
   a first capacitor structure having a lower portion formed in a first trench of a surface of the substrate and at least one first raised portion extending above the surface of the substrate;
   a second capacitor structure having a lower portion formed in a second trench of the surface of the substrate and at least one second raised portion extending above the surface of the substrate, the second trench separate from the first trench, the first capacitor structure and the second capacitor structure formed of superconducting material; and
   a Josephson junction between the first capacitor structure and the second capacitor structure, the Josephson junction disposed at a predetermined distance from the surface of the substrate and having a first end in physical contact with the first raised portion and a second end in physical contact with the second raised portion.

2. The qubit of claim 1, wherein the Josephson junction is formed of an insulating material sandwiched between second superconducting material.

3. The qubit of claim 2, wherein the second superconducting material is aluminum.

4. The qubit of claim 1, wherein the superconducting material is Niobium (Nb) and the substrate comprises Silicon (Si).

5. The qubit of claim 1, wherein the first capacitor structure and the second capacitor structure are of a trapezoidal shape in cross section.

6. The qubit of claim 1, further comprising a cavity formed between the Josephson junction and the substrate.

* * * * *